(12) United States Patent
Menon et al.

(10) Patent No.: US 10,247,773 B2
(45) Date of Patent: Apr. 2, 2019

(54) SYSTEMS AND METHODS FOR WIRELESS DEVICE TESTING

(71) Applicant: Intel Corporation, Santa Clara, CA (US)

(72) Inventors: Sankaran M. Menon, Austin, TX (US); Rehan M. Sheikh, Austin, TX (US); Rolf H. Kuehnis, Portland, OR (US); John Michael Peterson, Hillsboro, OR (US); Asifur Rahman, Portland, OR (US); Abram M. Detofsky, Tigard, OR (US); Mohsen Fazlian, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 15/200,997

(22) Filed: Jul. 1, 2016

(65) Prior Publication Data

US 2018/0003764 A1  Jan. 4, 2018

(51) Int. Cl.
*G01R 31/28* (2006.01)
*H04B 1/40* (2015.01)
*H04W 4/00* (2018.01)
*H04W 88/06* (2009.01)
*H04W 4/80* (2018.01)
*H04W 24/06* (2009.01)

(52) U.S. Cl.
CPC .......... *G01R 31/2834* (2013.01); *H04B 1/40* (2013.01); *H04W 4/80* (2018.02); *H04W 24/06* (2013.01); *H04W 88/06* (2013.01)

(58) Field of Classification Search
CPC ............ B25C 1/08; H04W 4/008; H04B 1/40
See application file for complete search history.

(56) References Cited

U.S. PATENT DOCUMENTS

| | | | | |
|---|---|---|---|---|
| 2005/0070226 | A1* | 3/2005 | Rigge | H04W 24/00 455/41.3 |
| 2006/0088018 | A1* | 4/2006 | Black | G01D 21/00 370/338 |
| 2006/0286990 | A1* | 12/2006 | Juan | H04W 24/00 455/466 |

(Continued)

*Primary Examiner* — Manuel A Rivera Vargas
*Assistant Examiner* — Yaritza H Perez Bermudez
(74) *Attorney, Agent, or Firm* — Eversheds Sutherland (US) LLP

(57) ABSTRACT

The disclosed systems, devices, and methods may provide for wireless testing of devices and, in particular, wireless testing of semiconductor devices comprising integrated circuits, memory, and logic circuitry that can be present on a wafer. The semiconductor devices can be tested for functional defects by applying one or more test patterns to the semiconductor devices. Further, for devices under test that do not have built-in wireless connectivity (for example, those that do not have a built-in Bluetooth low-energy engine), the disclosure describes systems and methods that the devices under test can use for external wireless connectivity (e.g., an external board having Bluetooth low-energy) on the low-bandwidth interface. In one example embodiment, for high-bandwidth scan testing, wireless connectivity modules (such as those implementing WiFi or WiGig) are described, which can be used to meet the bandwidth requirements of the one or more tests.

14 Claims, 10 Drawing Sheets

(56) References Cited

U.S. PATENT DOCUMENTS

| | | | |
|---|---|---|---|
| 2007/0211825 A1* | 9/2007 | Chang | H04L 27/122 375/303 |
| 2009/0066356 A1* | 3/2009 | Slupsky | G01R 1/07 324/754.31 |
| 2011/0006794 A1* | 1/2011 | Sellathamby | G01R 31/3025 324/754.03 |
| 2011/0244814 A1* | 10/2011 | Andreu | G01R 31/31722 455/90.1 |
| 2011/0267086 A1* | 11/2011 | Pagani | G01R 31/2884 324/754.21 |
| 2011/0309842 A1* | 12/2011 | Behzad | G01R 31/3025 324/501 |
| 2012/0052816 A1* | 3/2012 | Chang | H04W 24/06 455/67.12 |
| 2012/0268153 A1* | 10/2012 | Nickel | G01R 31/3025 324/754.31 |
| 2013/0179735 A1* | 7/2013 | Buckhurst | G01R 31/2834 714/35 |
| 2015/0067417 A1* | 3/2015 | Olgaard | H04W 24/06 714/712 |
| 2015/0253357 A1* | 9/2015 | Olgaard | H04B 17/15 324/750.26 |
| 2015/0323589 A1* | 11/2015 | Wang | G01R 31/2889 324/762.02 |
| 2016/0112884 A1* | 4/2016 | Hassan | H04B 17/318 370/328 |

* cited by examiner

SYSTEMS AND METHODS FOR WIRELESS DEVICE TESTING

TECHNICAL FIELD

This disclosure generally relates to testing of devices and more particularly to wireless testing of various electronic devices.

BACKGROUND

Manufacturing testing of devices (e.g., integrated circuits (ICs) and/or systems on chips (SoCs)) may be performed by applying test patterns by a tester to a loadboard containing the device under test (DUT). In some manufacturing testing—for example, in High Volume Manufacturing (HVM) testing—the devices under test may be removed and mounted on the loadboard. The removal and/or mounting of the devices under test can be performed using an automated handler to speed up the testing process. However, the process of removing and mounting the devices for the testing process can be time-consuming, costly, and cumbersome.

BRIEF DESCRIPTION OF THE FIGURES

Reference will now be made to the accompanying drawings, which are not necessarily drawn to scale, and wherein.

DETAILED DESCRIPTION OF EXAMPLE EMBODIMENTS

Figure 1:
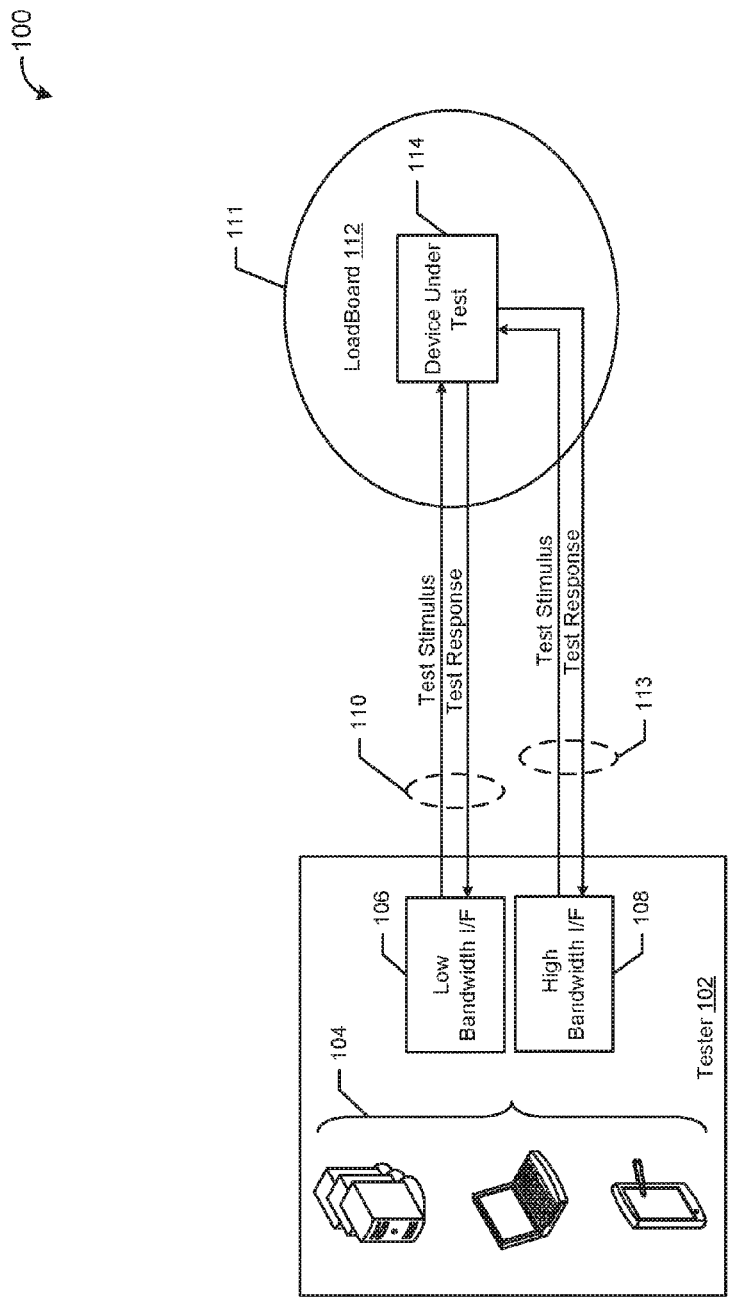
FIG. 1 shows a diagram of an example device test environment for testing (e.g., manufacturing testing) of devices in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the invention to those skilled in the art. Like numbers refer to like, but not necessarily the same or identical, elements throughout.

Embodiments of the disclosure may provide systems and methods for wireless testing of devices, and in particular, wireless testing of semiconductor devices comprising integrated circuits, memory, and logic circuitry that are present on a wafer that can be tested for functional defects by applying one or more test patterns to semiconductor devices.

In one embodiment, manufacturing tests may include two types. The first type of testing can be referred to as a wafer test (or a sort test), and the second type of testing can be referred to as a class test (or package test). Various embodiments of the disclosure can be directed to the class test, but can be used for the wafer test as well. Existing manufacturing testing systems and methods of devices (including integrated circuits, ICs, and/or systems on a chip, SoCs) can be performed by applying various test patterns to a device under test on a loadboard. These test patterns can refer to test sequences that, when applied to the digital circuits and memories of a device under test (DUT), can allow the testing device (alternatively referred to as a tester herein) to distinguish between correct circuit behavior and faulty circuit behavior, for example, faulty circuit behavior caused by one or more processing defects in the fabrication of the device under test. The generated patterns can be used to test semiconductor devices after manufacture, and in some cases to assist with determining the cause of failure (failure analysis). During High Volume Manufacturing (HVM) testing, the device under test (e.g., the SoC/IC) can be removed and mounted using an automated handler to speed up the testing process. The process of removing and mounting new devices under test (e.g., different SoCs/ICs) for testing in an HVM process can be time-consuming and cumbersome.

In various embodiments, the disclosure describes the use of a wireless connection (for example, a Bluetooth low energy connection) within a DUT (e.g., the SoC and/or IC) to connect to a parallel to serial interface device, for example, a universal asynchronous receiver/transmitter (UART). The UART can, in turn, connect to a low bandwidth (e.g., a Joint Test Action Group, JTAG) or Boundary Scan Side Band (BSSB) logic module to establish a connection with the tester. In one embodiment, the wireless connection, for example, the wireless connectivity circuitry disclosed throughout this disclosure can include, but is not limited to, Bluetooth, Bluetooth low-energy, near-field communication (NFC), or any other suitable wireless connection including, but not limited to, wireless connections having a pairing mechanism. Further, for devices under test that do not have built-in wireless connectivity (for example, those that do not have a built-in Bluetooth low-energy engine), the disclosure describes systems and methods whereby the devices under test can use external wireless connectivity (e.g., an external board having Bluetooth low-energy) on the low-bandwidth (e.g., the JTAG) interface. In one example embodiment, for high-bandwidth scan testing, wireless connectivity modules (such as those implementing WiFi or WiGig) are described, which can be used to meet the bandwidth requirements of the one or more tests. In one embodiment, various modules may be used for high-bandwidth scan testing, for example, the high bandwidth communication circuitry described throughout this disclosure can include, but is not limited to, WiFi, WiGig, WiFi HaLow (associated with the internet of things (IoT)), or any other suitable wireless connection including, but not limited to, any high bandwidth wireless connections (e.g., wireless connections having a bandwidth greater than a predetermined threshold, for example, 10 Mbps). In various embodiments, the disclosed systems and methods are further described as wired connections (e.g., Peripheral Component Interconnect Express (PCIe) and/or Thunderbolt (TBT)) for high-bandwidth scan testing and wireless connections (e.g., Bluetooth low-energy connections) for low-bandwidth (e.g., JTAG based) testing. In a further embodiment, the wired PCIe connection can be made wireless by using wireless connectivity modules such as those implementing WiFi or WiGig to send and receive information to the PCIe and/or TBT interfaces for delivering scan patterns and external boards (for example, field-programmable gate array (FPGA)-based boards) having a wireless (e.g., Bluetooth) controller for low bandwidth (e.g., JTAG based) test patterns. In various embodiments, the disclosed wireless connectivity circuitry and/or the wireless communication interface described throughout this disclosure can include any future wireless or partially wireless technology, for example including, but not limited to, any future wireless technology implementing a future IEEE communications standard.

In various embodiments, the disclosure describes testing (e.g., High Volume Manufacturing (HVM) testing) of semiconductor devices using a minimal connection of pins to the device under test (DUT). In one embodiment, the systems and methods can be performed using power and ground signals resulting in a reduced usage of pins for testing. Further, the signaling for testing can be performed wirelessly; this can save time by reducing signal settling time, thereby improving throughput. Further, during burn-in testing, test signals exchanged with the DUT can be applied and received wirelessly. This can save time during loading the DUT inside a burn-in chamber as well as in applying and receiving the test signals and responses. Moreover, in various embodiments, the design for test (DFT) of the DUT and the test hardware infrastructure can be simplified as a result of implementing the systems and methods disclosed herein. For manufacturers, the devices can be tested on customer boards before shipping to customers, as well as testing the devices on returned parts, thereby saving time. This is at least because, with wired testing, the device under test may need to be de-soldered for applying the tests, which can take additional time and resources. In various embodiments disclosed herein, however, the various tests (e.g., the various HVM tests) can be performed on devices under test mounted on original manufacturer boards (as well as returned boards) without de-soldering the devices. Further, various example embodiments of this disclosure can enable component marginality validation (CMV), for example, using the disclosed wireless testing.

FIG. 1 shows a diagram of an example device test environment 100 for class testing of devices in accordance with example embodiments of the disclosure. As shown in FIG. 1, a tester 102 can comprise one or more computers 104, the computers 104 being connected to one or more test interfaces 106 and 108. The test interfaces 106 and 108 can include a low bandwidth interface 106, for example, a Joint Test Action Group (JTAG) interface, and a high bandwidth interface 108, for example, a scan interface. The environment 100 can further include a device under test setup 111 comprising a device under test 114. The device under test 114 can include, for example, a system on a chip (SoC) and/or an integrated circuit (IC). Further, the device can be situated on a loadboard 112.

In one embodiment, the tester 102 can use the test interfaces 106 and 108 to transmit and receive test signals from/to the tester 102 to/from the device under test 114, respectively. In a first embodiment, the low bandwidth interface 106 can be used in connection with one or more memory tests of the device under test 114, the memory tests including, for example, a memory built-in self-test (BIST). For example, the low bandwidth interface 106 can send low bandwidth signaling 110 comprising one or more test stimulus signals to the device under test 114 and receive one or more test responses. In one embodiment, the low bandwidth interface 106 can include a JTAG interface and can include a serial interface. In one embodiment, the high bandwidth interface 108 can be used for logic testing of the circuitry of the device under test 114, for example, for the logic testing of the flip/flops and/or controllers comprising the device under test 114. For example, the high bandwidth interface 108 can send high bandwidth signaling 113 comprising one or more test stimulus signals to the device under test 114 and receive one or more test responses in return.

In an embodiment, the tester 102 can touch the pins (not shown) of the devices and apply the sets of test patterns (such as the memory BIST tests, and the like). For the low bandwidth (e.g., JTAG) interface tests, a pass/fail status can be obtained. For these types of tests, the tester 102 can initiate the memory tests by the low bandwidth interface 106 by touching the pins, applying the test patterns, and reading the response of the tests. This can be time-consuming because the dies may need to be physically handled, for example, by an automated handler, and mounted on the loadboard 112 to apply the tests by the tester 102. Further, the physical handling of the devices can cause pin breakage on the loadboard 112 and/or the device under test 114.

Further, another set of scan tests can be applied by the tester 102 using the high bandwidth scan interface 108. For these tests, the tester 102 can use various scan-in and scan-out pins (not shown) to apply the scan tests and to capture the response of the scan tests by the device under test 114 to assess the scan coverage of the device under test 114.

Figure 2:
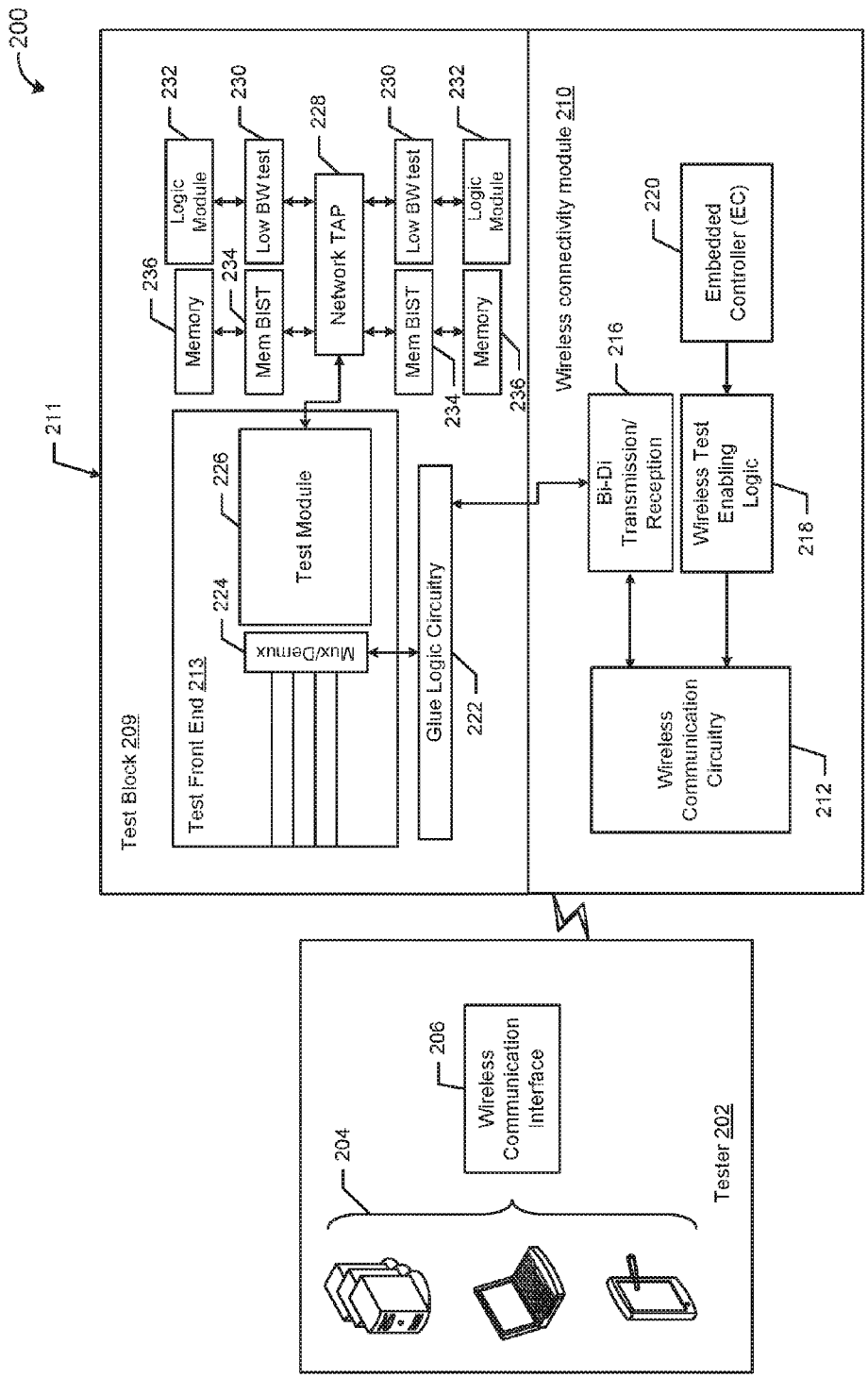
FIG. 2 shows a diagram of an example device test environment for testing of devices where the device under test includes wireless connectivity for low bandwidth testing, in accordance with example embodiments of the disclosure.

FIG. 2 shows a diagram of an example device test environment for class testing of devices in accordance with example embodiments of the disclosure. The test environment can include a tester 202 and a device under test 211. In one embodiment, the device under test 211 may include a wireless connectivity module 210 and a test block 209. The wireless connectivity module 210 can include several components (discussed below) for the wireless transmission and reception of one or more tests in accordance with example embodiments of the systems and methods disclosed herein. In one embodiment, the test block 209 can further include a test front end 213. The test front end 213 can include a test module 226, which can be used for the execution of one or more tests.

As shown in FIG. 2, the tester 202 can include one or more computers 204 and a first wireless communication interface 206. The wireless communication interface 206 can include a Bluetooth interface. The Bluetooth interface can be a low-energy interface. Further, the device under test 211 can include a wireless connectivity module 210, including a wireless communication circuitry 212. The wireless communication circuitry 212 can include a Bluetooth low energy circuitry. The wireless connectivity module 210 can further comprise an embedded controller (EC) enabling mechanism 220 for wireless connectivity, which can be connected to a wireless test enabling logic circuitry 218. The EC enabling mechanism 220 can, in various embodiments, turn on the wireless communication circuitry 212. During manufacturing testing, the wireless connectivity (e.g., the Bluetooth low energy) can be enabled by a predetermined mechanism, for example, a pin-strap, which can involve shorting two pins on the manufacturing flow. The shorting of the pins can turn on the Bluetooth low energy engine on the device under test 211, for example, using the EC enabling mechanism 220 to enable wireless connectivity. This can, in turn, enable the tester's 202 Bluetooth low energy mechanism to pair with the device under test that has its Bluetooth low energy turned on.

In one embodiment, a wireless communication circuitry 212 can convert the received test patterns to a JTAG bit-stream to communicate with the device under test (for example, a SoC processor) via a bi-directional (bi-di) transmission/reception module 216, for example, a universal asynchronous receiver/transmitter (UART). The bi-di transmission/reception module 216 can further communicate with a glue logic circuitry 222 (for example, a UART to JTAG bridge device) between the bi-di transmission/reception module 216 and the low BW test module 230 on the device under test 211 for conversion to a low bandwidth (e.g., a JTAG) protocol. The glue logic circuitry 222 can allow for the transmission of tests outputted by the tester 202 wirelessly to the wireless communication circuitry 212 to the various memory and logical circuits of the device under test 211.

In various aspects, the test front end 213 may further comprise a multiplexer/demultiplexer (Mux-Demux) unit 224, and a test module 226, for example, a JTAG 1149.x or BSSB logic module. In one embodiment, the test module 226 can communicate with a network test access port (TAP) 228 to coordinate the test of the memory, including, but not limited to, memories 236, logic module 232 (for example, SoCs, memory controllers, graphics hubs, display hubs, and/or system hubs, and the like), memory built-in self-testing modules (BISTs) 234, and low bandwidth (for example, JTAG-based) test module 230. The tester 202 can then sequentially run test programs in conjunction with the memory BIST 234 to test the memories 236 in the device under test 211. Once the memory BIST 234 tests the memories, the result (for example, a pass or a fail) can be sent back by the bi-di transmission/reception module 216 (e.g., the UART) and the wireless communication circuitry 212 (e.g., a Bluetooth low energy circuitry) back to the tester 202. Similarly, other tests, such as other low-bandwidth tests (for example, those that are JTAG-based) can also be applied to the various logic modules 232. Some of the low-bandwidth tests can include, but are not limited to, process-monitoring tests, intra-die variability (IDV) tests, and the like. For some products that implement logic built-in self-tests (BISTs), this disclosure can provide a way to apply low-bandwidth tests (for example, those that are JTAG-based) to run the logic-BIST tests and to capture the results wirelessly to determine the result (e.g., pass or fail).

In various embodiments, there can be situations where the device under test does not have a wireless connectivity module (e.g., an integrated Bluetooth low energy circuitry) or in some cases, the wireless connectivity module (e.g., an integrated Bluetooth low energy circuitry) may not be functional. In such scenarios, if wireless testing needs to be done, then the systems and methods described below can be used.

Figure 3:
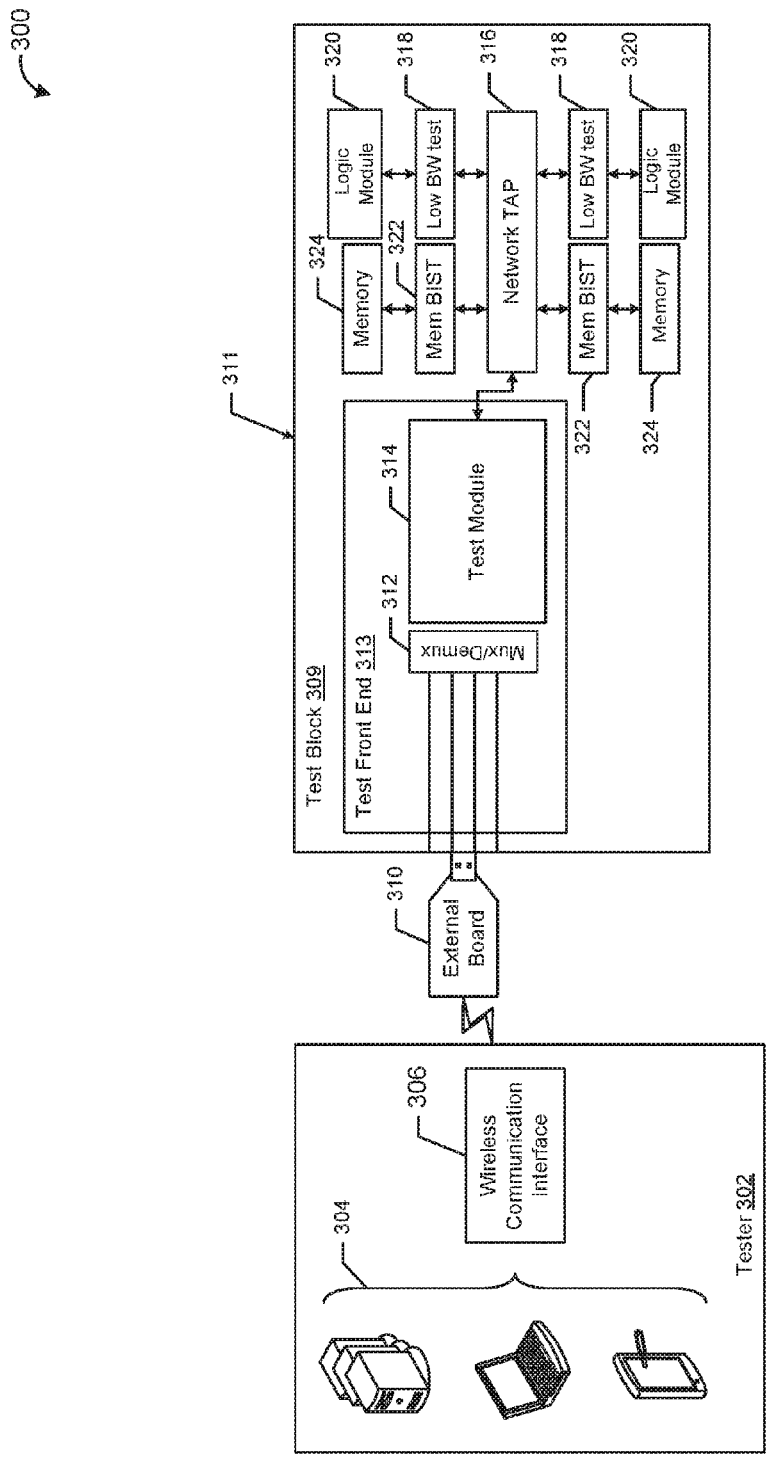
FIG. 3 shows a diagram of an example device test environment for testing of devices where the device under test includes wireless connectivity for low bandwidth testing, in accordance with example embodiments of the disclosure.

FIG. 3 shows a diagram of an example device test environment 300 for class testing of devices in accordance with example embodiments of the disclosure. FIG. 3 shows an example embodiment where either the wireless connectivity module (for example, the wireless connectivity module 210 as shown in FIG. 2) either does not exist on the device under test 311 or is defective. The test environment can include a tester 302 and a device under test 311. In one embodiment, the device under test 311 may include a test block 309. The device under test 311 can include several components (discussed below) for the wireless transmission and reception of one or more tests in accordance with example embodiments of the systems and methods disclosed herein. In one embodiment, the test block 309 can further include a test front end 313. The test front end 313 can include a test module 314, which can be used for the execution of one or more tests.

As shown in FIG. 3, the tester 302 can once again include one or more computers 304 and a first wireless communication interface 306. The wireless communication interface 306 can include a Bluetooth interface. The Bluetooth interface can be a low-energy interface. However, in contrast to FIG. 2, the device under test 311 (for example, a SoC apps processor) can include an external board 310, for example, a field-programmable gate array (FPGA) board with a wireless communication interface, for example, a Bluetooth low-energy, instead of the wireless connectivity module 210 including the wireless communication circuitry 212 of FIG. 2.

In one embodiment, the external board 310, for example, the FPGA board with Bluetooth low-energy, can be connected to an unused interface of the device under test 311 (for example, a SoC apps processor), for example, a USB port of the device under test 311. For example, the USB port of the device under test 311 may be unused because the device under test 311 instead uses a Boundary Scan Side Band (BSSB) (not shown). Thus, the external board 310 can connect to the test module 314 (e.g., a BSSB logic module) of the device under test 311. The external board 310 can thereby connect to a low bandwidth (e.g., JTAG) module port of a Chip-Level Test Access Point (CLTAP) (not shown) of the test module 314, which can provide a gateway into the network TAP 316 of the device under test 311.

In various embodiments, once the external board 310 establishes a connection with the test module 314 of the device under test 311. The tester 302 can communicate wirelessly, for example, through Bluetooth low energy circuitry with the Bluetooth low energy circuitry logic on the external board 310. The tester 302 can send and receive various low bandwidth (e.g., JTAG-based) communications representative of the tests of and/or the signals to/from the one or more devices under test 311. The tester 302 can, for example, send and receive various low bandwidth (e.g., JTAG-based) communications for running memory BIST tests as well as other low bandwidth (e.g., JTAG-based) tests, such as process monitor tests, and the like.

In one embodiment, the external board 310 can contain the Bluetooth low-energy block that pairs with the wireless communication interface 306 (e.g., a Bluetooth low-energy interface) in the tester 302. The external board 310 can also contain the glue logic circuitry (for example, a UART to JTAG bridge device, not shown, but similar to the glue logic circuitry 222 of FIG. 2 (for example, a UART to JTAG bridge device) which can convert the received commands to JTAG protocol. The converted received commands can then be applied to the Mux/Demux 312 and the test module 314 (e.g., BSSB logic) inputs of the device under test 311. The converted received commands can then be received by the network TAP 316 of the device under test 311. The commands can then be applied to the low bandwidth tests, for example, the memory BIST 322 and low bandwidth (BW) tests 318 to coordinate the test of the memory including, but not limited to, memories 324, logic modules 320 (for example, SoCs, memory controllers, graphics hubs, display hubs, and/or system hubs and the like), memory BISTs 322, and low BW test modules 318 (e.g., JTAG-based), as well as perform one or more scan tests. For example, the tester 302 can sequentially run test programs in conjunction with the memory BIST 322 to test the memories 324 in the device under test 311. Once the memory BIST 322 tests the memories, the result (for example, a pass or a fail) can be sent back by the external board 310 to the tester 302. Similarly, other tests, such as other low-bandwidth tests (for example, those that are JTAG-based), can also be applied to the various logic modules 320. Some of the low-bandwidth tests can include, but are not limited to, process-monitoring tests, IDV tests, and the like. For some products that implement logic built-in self-tests (BISTs), this disclosure can provide systems and methods to apply low-bandwidth tests (for example, those that are JTAG-based) to run the logic-BIST tests and to capture the response of the device(s) under test 311 wirelessly to determine the result (e.g., pass or fail).

In one embodiment, for scan testing, the bandwidth requirements can be higher compared to memory testing. The number of scan inputs and outputs can, for example, be between 8 to 32 for conventional scan testing. Further, the scan shift frequency can be anywhere from about 50 MHz to about 100 MHz. For wireless testing of devices, higher scan rates may shift the frequency requirements and may require a larger number of scan inputs/outputs, and the wireless bandwidth requirements may increase.

In another embodiment, the bandwidth requirements for WiFi 802.11g and 802.11n may be about 54 Mbps and about 300 Mbps, respectively. For the use of IEEE 802.11n for manufacturing tests, the frequency bandwidth and the number of scan-ins and scan-outs can be about 33 MHz and 8 scan-ins to meet the WiFi bandwidth requirements of about 300 Mbps. A frequency of 33 MHz using 8 scan chains may require a bandwidth of about 240 Mbps, which may be under the 300 MHz bandwidth provided by IEEE 802.11n.

In one embodiment, for higher-bandwidth scan testing, WiGig can be used. WiGig can operate at about 60 GHz, providing a bandwidth of about 1 GHz. WiGig can provide a bandwidth of about 1 Gbps which enables a scan frequency of about 100 MHz using 8 scan chains or about 50 MHz scan frequency using 16 scan chains, or about 25 MHz scan frequency using 32 scan chains. Any of these scan frequency and scan chain configurations are possible for the current WiGig bandwidth. The principle with which WiFi or WiGig can be used for manufacturing tests is given below, in an example embodiment.

Figure 4:
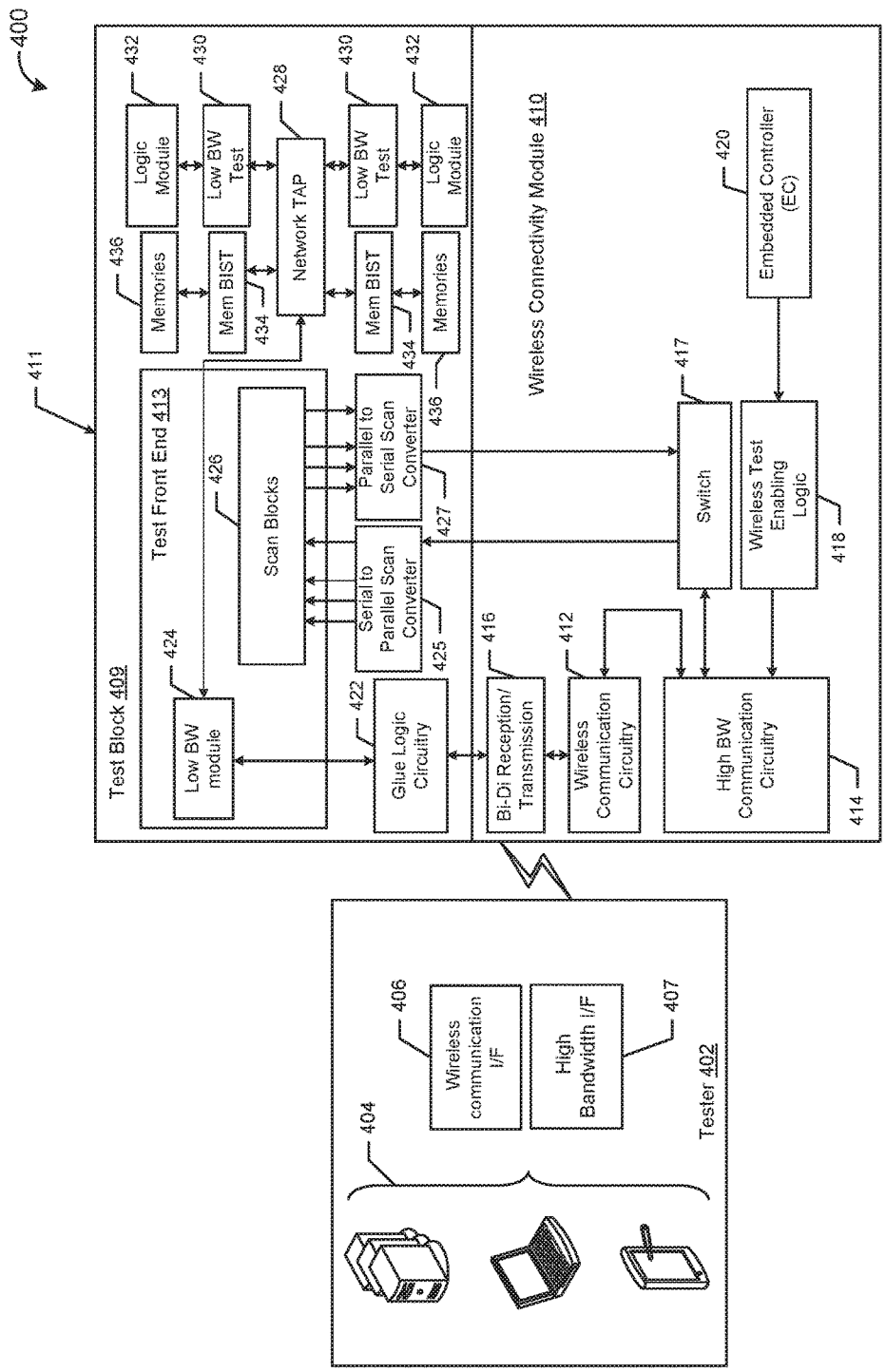
FIG. 4 shows a diagram of an example device test environment for testing of devices where the device under test includes wireless connectivity for low bandwidth testing and high bandwidth wireless testing connectivity for high bandwidth testing, in accordance with example embodiments of the disclosure.

FIG. 4 shows a diagram of an example device test environment 400 for testing of devices in accordance with example embodiments of the disclosure. In particular, FIG. 4 shows a wireless communication (e.g., a Bluetooth low-energy) implementation for low-bandwidth (e.g., JTAG based) testing. The wireless communication implementation test can be used in memory BIST testing but also for scan testing. For scan testing, the scan patterns may need to be applied at higher speeds and bandwidth as compared with the lower bandwidth memory tests. For example, the higher speed and bandwidth can use WiFi 802.11n, which can provide a bandwidth of approximately 300 Mbps. Alternatively or additionally, the higher speed and bandwidth can use WiGig to provide a bandwidth of approximately 1 Gbps.

As mentioned, FIG. 4 shows a diagram of an example device test environment for testing of devices in accordance with example embodiments of the disclosure. The test environment can include a tester 402 and a device under test 411. In one embodiment, the device under test 411 may include a wireless connectivity module 410 and a test block 409. The wireless connectivity module 410 can include several components (discussed below) for the wireless transmission and reception of one or more tests in accordance with example embodiments of the systems and methods disclosed herein. In one embodiment, the test block 409 can further include a test front end 413. The test front end 413 can include a low bandwidth module 424, which can be used for the execution of one or more tests.

As shown in FIG. 4, the tester 402 can include one or more computers 404 and a first wireless communication interface 406 and a high-bandwidth communication interface 407. The wireless communication interface 406 can include a Bluetooth interface. The Bluetooth interface can be a low-energy interface. The high-bandwidth communication interface 407 can include, for example, a WiFi/WiGig interface.

In another embodiment, the device under test 411 can include a wireless connectivity module 410, including a wireless communication circuitry 412. The wireless communication circuitry 412 can include a Bluetooth low energy circuitry. The wireless connectivity module 410 can further comprise an embedded controller (EC) enabling mechanism 420 for wireless connectivity, which can be connected to a wireless test enabling logic circuitry 418 that can enable the wireless communication circuitry 412. For example, during manufacturing testing, the Bluetooth low energy can be enabled by a predetermined mechanism, for example, a pin-strap, which can involve shorting two pins on the manufacturing flow. The shorting of the pins can turn on the wireless communication circuitry (e.g., the Bluetooth low energy engine on the device) using the EC enabling mechanism 420 to enable wireless connectivity. This can, in turn, enable the tester's 402 wireless communication interface 406 (e.g., Bluetooth low energy circuitry) mechanism to pair with the wireless communication circuitry 412 of the device under test 411. Further, the wireless connectivity module 410 can include a high-bandwidth communication circuitry 414 communicatively coupled to a switch 417. The switch 417 can turn on the high-bandwidth communication circuitry 414 and allow for communication with the high-bandwidth communication interface 407 of the tester 402. In one embodiment, the high bandwidth communication circuitry 414 and/or the high-bandwidth communication interface 407 can include, but is not limited to, WiFi, WiGig, WiFi HaLow (associated with the internet of things (IoT)), or any other suitable wireless connection including, but not limited to, any high bandwidth wireless connections (e.g., wireless connections having a bandwidth greater than a predetermined threshold, for example, about 10 Mbps).

In another embodiment, the wireless communication circuitry 412 can communicate with the device under test 411 (for example, a SoC apps processor) via a bi-directional (bi-di) transmission/reception module 416, for example, a UART. The bi-di transmission/reception module 416 can further communicate with a glue logic circuitry 422 (for example, a UART to JTAG bridge device) on the device under test 411. The glue logic circuitry 422 can allow for the transmission of tests outputted by the tester 402 wirelessly to and from the wireless communication circuitry 412 and to and from the various memory and logical circuits of the device under test 411. Further, the tests sent by the tester 402 can be received by the wireless communication circuitry 412 of the device under test 411. The wireless communication circuitry 412 can convert the low bandwidth (e.g., JTAG-based) tests to a low bandwidth (e.g., JTAG) bit-stream. The bit-stream can be applied to and from the bi-di transmission/reception module 416 (e.g., a UART) and be converted to a low bandwidth (e.g., JTAG-based) protocol by the glue logic circuitry 422 (for example, a UART to JTAG bridge device).

In one embodiment, the low bandwidth module 424 (e.g., JTAG) can communicate with a network test access point (TAP) 428 to coordinate the test of the memory including, but not limited to, memories 436, logic module 432 (for example, SoCs, memory controllers, graphics hubs, display hubs, and/or system hubs, and the like), memory BISTs 434, and low bandwidth test modules 430 (e.g., JTAG-based). The tester 402 can sequentially run test programs in conjunction with the memory BIST 434 to test the memories 436 of the device under test 411. Once the memory BIST 434 tests the memories, the result (for example, a pass or a fail) can be sent back by the bi-di transmission/reception module 416 (e.g., a UART) and the wireless communication circuitry 412 (e.g., Bluetooth low-energy) back to the tester 402. Similarly, other tests, for example, other low-bandwidth tests (for example, those that are JTAG-based) can also be applied to the various logic modules 432. Some of the low-bandwidth tests can include, but are not limited to, process-monitoring tests, IDV tests, and the like. For some products that implement logic built-in self-tests (BISTs), this disclosure can provide a way to apply low-bandwidth tests (for example, those that are JTAG-based) to run the logic-BIST tests and to capture the results wirelessly to determine the result (e.g., pass or fail).

In various embodiments, scan patterns can be wirelessly sent to the high-bandwidth communication circuitry 414 (e.g., WiFi/WiGig) in the device under test 411. From there, the scan patterns can be sent by the switch 417 to a serial to parallel scan converter 425 to convert the scan patterns to the number of scan inputs for the scan blocks 426. The scan outputs from the scan blocks can be sent to the parallel to serial scan converter 427, which can convert the parallel scan outputs to serial outputs. From here the serial scan outputs can be sent back to the high-bandwidth communication circuitry 414 (e.g., WiFi/WiGig) by the switch 417. The high-bandwidth communication circuitry 414 (e.g., WiFi/WiGig) can then transmit the scan outputs wirelessly to the tester 402.

Figure 5:
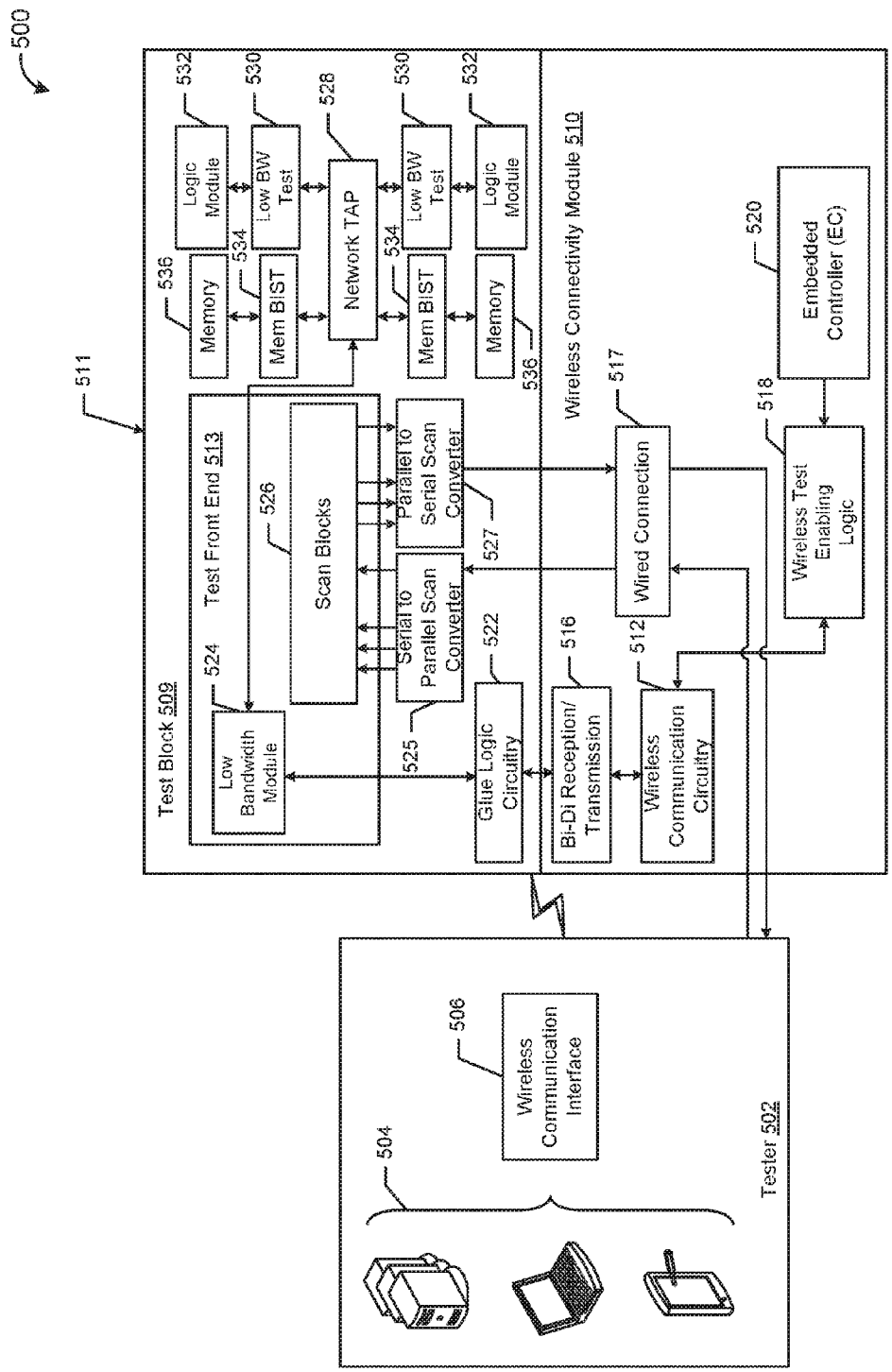
FIG. 5 shows a diagram of an example hybrid device test environment for testing of devices where the device under test includes wireless connectivity for low bandwidth testing and high bandwidth wired testing connectivity for high bandwidth testing, in accordance with example embodiments of the disclosure.

FIG. 5 shows a diagram of an example hybrid device test environment 500 for class testing of devices in accordance with example embodiments of the disclosure. In particular, FIG. 5 shows a hybrid approach where a wired connection (for example, a PCIe or Thunderbolt (TBT)) wired (or connector-based) connection is used for high bandwidth (e.g., scan type) testing, while a wireless connection (e.g., a Bluetooth low-energy connection) is used for low bandwidth (e.g., JTAG) testing.

As mentioned, FIG. 5 shows a diagram of an example device test environment for testing of devices in accordance with example embodiments of the disclosure. The test environment can include a tester 502 and a device under test 511. In one embodiment, the device under test 511 may include a wireless connectivity module 510 and a test block 509. The wireless connectivity module 510 can include several components (discussed below) for the wireless transmission and reception of one or more tests in accordance with example embodiments of the systems and methods disclosed herein. In one embodiment, the test block 509 can further include a test front end 513. The test front end 513 can include a low bandwidth module 524, which can be used for the execution of one or more tests.

In one embodiment, as shown in FIG. 5, the tester 502 can apply one or more high-speed serialized scan patterns through pins by a wired connection 517 (e.g., a PCIe and/or the Thunderbolt (TBT) interface). The PCIe and/or the Thunderbolt (TBT) interface may use a smaller number of pins to interface with the tester 502 as opposed to applying 32 scan inputs and 32 scan outputs.

Further, scan patterns can be sent to the high-bandwidth wired connection 517 (e.g., the PCIe or the TBT wired connection) in the device under test 511. From there the scan patterns can be sent by the high-bandwidth wired connection 517 to a serial to parallel scan converter 525 to convert the scan patterns to the number of scan inputs for the scan blocks 526. The scan outputs from the scan blocks can be sent out to the parallel to serial scan converter 527, which can convert the parallel scan outputs to serial outputs. From here the serial scan outputs can be sent back to the tester 502 by the high-bandwidth wired connection 517.

Further, the device under test 511 can include a wireless connectivity module 510, including a wireless communication circuitry 512. The wireless communication circuitry 512 can include a Bluetooth low energy circuitry. The wireless connectivity module 510 can further comprise an embedded controller (EC) enabling mechanism 520 for wireless connectivity, which can be connected to a wireless test enabling logic circuitry 518 that can enable the wireless communication circuitry 512. For example, during manufacturing testing, the wireless communication circuitry 512 (e.g., the Bluetooth low energy) can be enabled by a predetermined mechanism, for example, a pin-strap, which can involve shorting two pins on the manufacturing flow. The shorting of the pins can turn on a wireless communication circuitry (e.g., the Bluetooth low energy engine) on the device under test 511 using the EC enabling mechanism 520 to enable wireless connectivity. This can, in turn, enable the tester's 502 wireless communication interface 506 (e.g., the Bluetooth low energy) to pair with the device under test 511 that has wireless communication circuitry 512 (e.g., the Bluetooth low energy) turned on.

The wireless communication circuitry 512 can communicate with the device under test 511 (for example, a SoC apps processor) via a glue logic circuitry 522, for example, a UART. The bi-directional (bi-di) transmission/reception module 516 can further communicate with a glue logic circuitry 522 (for example, a UART to JTAG bridge device) on the device under test 511. The bi-di transmission/reception module 516 can allow for the transmission of tests outputted by the tester 502 wirelessly to the wireless communication circuitry 512 to the various memory and logical circuits of the device under test 511. As a result, the JTAG-based tests sent by the tester 502 can be received by the wireless communication circuitry 512 of the device under test 511. The wireless communication circuitry 512 can convert the low bandwidth (e.g., JTAG-based) tests to a low bandwidth (e.g., JTAG) bit-stream. The bit-stream can be applied to the bi-di transmission/reception module 516 (e.g., the UART) and be converted to a low bandwidth (e.g., JTAG-based) protocol by the glue logic circuitry 522 (for example, a UART to JTAG bridge device).

In one embodiment, the low bandwidth module 524 (e.g., JTAG) can communicate with a network test access point (TAP) 528 to coordinate the test of the memory including, but not limited to, memories 536, logic modules 532 (for example, SoCs, memory controllers, graphics hubs, display hubs, and/or system hubs and the like), memory BISTs 534, and low bandwidth test modules 530 (e.g., JTAG-based). The tester 502 can sequentially run test programs in conjunction with the memory BIST 534 to test the memories 536 of the device under test 511. Once the memory BIST 534 tests the memories, the result (for example, a pass or a fail) can be sent back by the bi-di transmission/reception module 516 (e.g., the UART) and the wireless communication circuitry 512 (e.g., the Bluetooth low-energy) back to the tester 502. Similarly, other tests, for example, other low-bandwidth tests (for example, those that are JTAG-based) can also be applied to the various logic modules 532 (for example, SoCs, memory controllers, graphics hubs, display hubs, and/or system hubs, and the like). Some of the low-bandwidth tests can include, but are not limited to, process-monitoring tests, IDV tests, and the like. For some products that implement logic built-in self-tests (BISTs), this disclosure can provide a way to apply low-bandwidth tests (for example, those that are JTAG-based) to run the logic-BIST tests and to capture the results wirelessly to determine the result (e.g., pass or fail).

Figure 6:
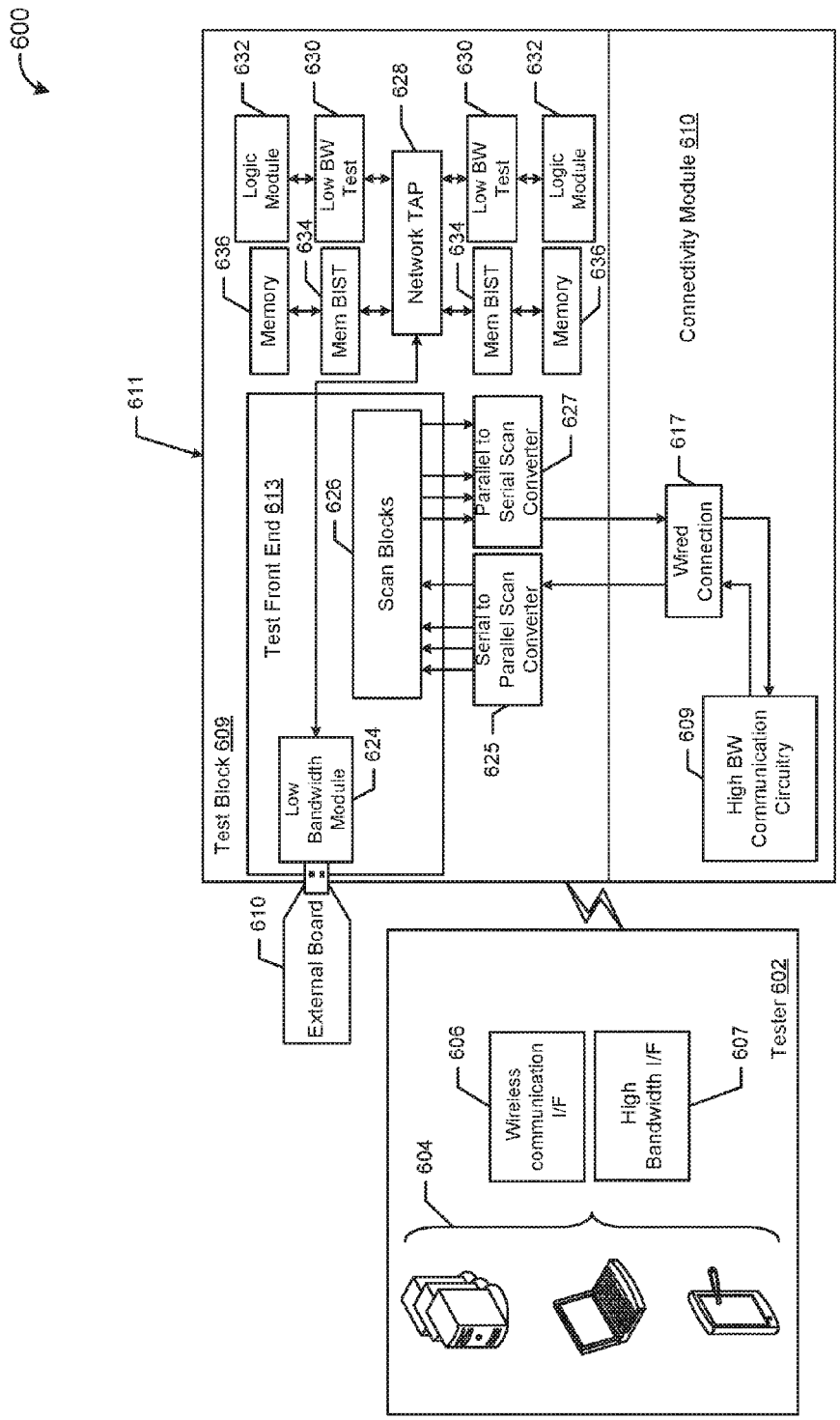
FIG. 6 shows a diagram of an example device test environment for testing of devices where the device under test includes an external wireless connectivity for low bandwidth testing and external high bandwidth wireless testing connectivity for high bandwidth testing, in accordance with example embodiments of the disclosure.

FIG. 6 shows a diagram of an example device test environment 600 for testing of devices where the device under test includes an external wireless connectivity for low bandwidth testing and external high bandwidth wireless testing connectivity for high bandwidth testing, in accordance with example embodiments of the disclosure. As mentioned, FIG. 6 shows a diagram of an example device test environment for testing of devices in accordance with example embodiments of the disclosure. The test environment can include a tester 602 and a device under test 611. In one embodiment, the device under test 611 may include a connectivity module 610 and a test block 609. The connectivity module 610 can include several components (discussed below) for the transmission and reception of one or more tests in accordance with example embodiments of the systems and methods disclosed herein. In one embodiment, the test block 609 can further include a test front end 613. The test front end 613 can include a low bandwidth module 624, which can be used for the execution of one or more tests.

This scheme shown in FIG. 6 can be useful for manufacturing tests when there may not be an integrated wireless connectivity in the device under test or when the internal wireless connectivity is non-functional. In such situations, an external board 610 (for example, a FPGA board) with wireless (e.g., Bluetooth low-energy) connectivity can be used for applying low bandwidth (e.g., JTAG-based) test patterns as described above. As shown in FIG. 6, for providing scan testing using scan patterns, an external high bandwidth wireless communication circuitry 609 (e.g., WiFi/WiGig) can be used. The external high bandwidth wireless communication circuitry 609 (e.g., WiFi/WiGig) can receive high bandwidth scan patterns from the tester 602 and convert them to serial format. Further, scan patterns can be sent by the high-bandwidth wireless communication circuitry 609 to a wired connection 617 (e.g., the PCIe or the TBT wired connection) in the device under test 611. From there the scan patterns can be sent by the high-bandwidth wired connection 617 to a serial to parallel scan converter 625 to convert the scan patterns to the number of scan inputs for the scan blocks 626. The scan outputs from the scan blocks 626 can be sent out to the parallel to serial scan converter 627, which can convert the parallel scan outputs to serial outputs. From here the serial scan outputs can be sent back to the tester 602 by the high-bandwidth wired connection 617.

In various embodiments, because the communication between the tester 602 and the SoC/IC is wireless, the wireless connectivity (e.g., using Bluetooth low-energy) as well as the high bandwidth wireless communication circuitry 609 (e.g., using WiFi/WiGig) may use one or more antenna traces. This antenna can also be part of the interposer or depending on the frequency of operation, it can also be implemented on silicon.

In one embodiment, the low bandwidth module 624 (e.g., JTAG) can communicate with a network test access point (TAP) 628 to coordinate the test of the memory including, but not limited to, memories 636, logic modules 632 (for example, SoCs, memory controllers, graphics hubs, display hubs, and/or system hubs and the like), memory BISTs 634, and low bandwidth test modules 630 (e.g., JTAG-based). The tester 602 can sequentially run test programs in conjunction with the memory BIST 634 to test the memories 636 of the device under test 611. Once the memory BIST 634 tests the memories, the result (for example, a pass or a fail) can be sent back by the bi-di transmission/reception module (not shown in the FIG.) (e.g., the UART) and the wireless communication circuitry (not shown in the FIG.) (e.g., the Bluetooth low-energy) back to the tester 602. Similarly, other tests, for example, other low-bandwidth tests (for example, those that are JTAG-based) can also be applied to the various logic modules 632 (for example, SoCs, memory controllers, graphics hubs, display hubs, and/or system hubs, and the like). Some of the low-bandwidth tests can include, but are not limited to, process-monitoring tests, IDV tests, and the like. For some products that implement logic built-in self-tests (BISTs), this disclosure can provide a way to apply low-bandwidth tests (for example, those that are JTAG-based) to run the logic-BIST tests and to capture the results wirelessly to determine the result (e.g., pass or fail).

Figure 7:
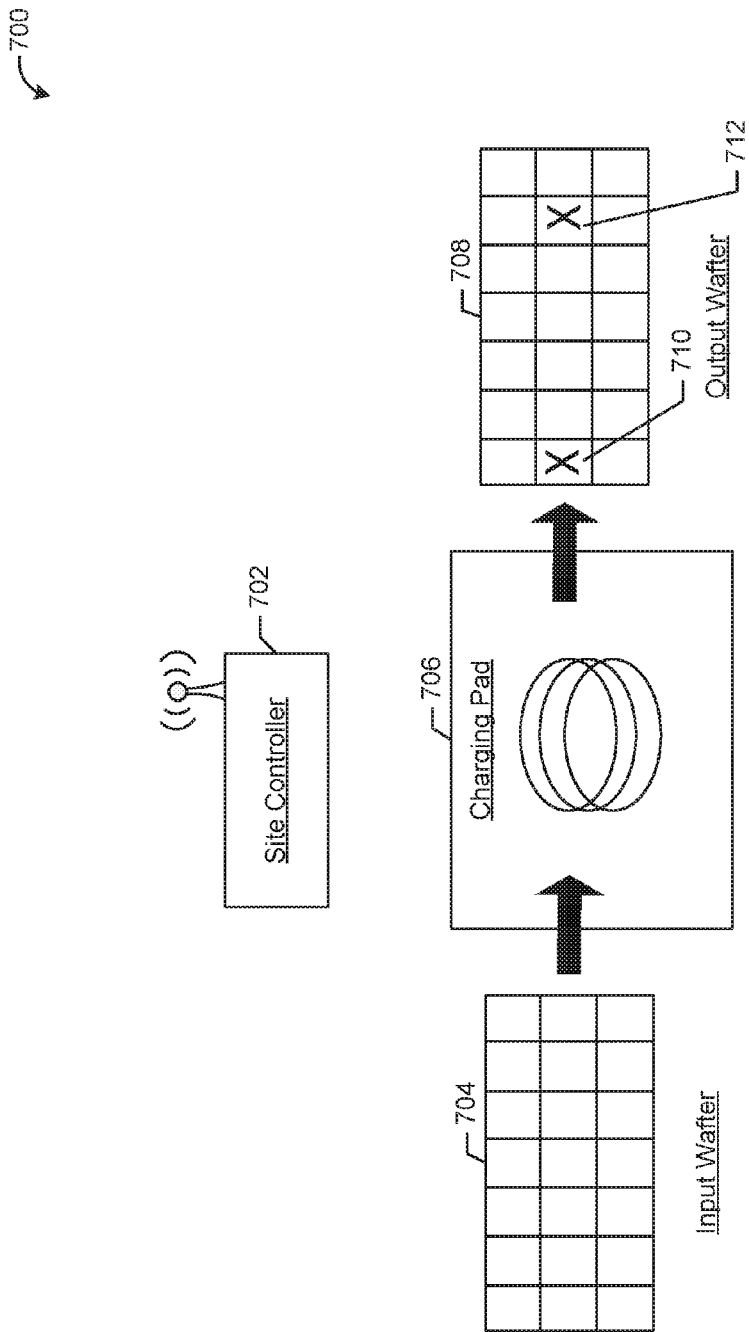
FIG. 7 shows a diagram of an example embodiment of the disclosure wherein a site controller can broadcast one or more tests to one or more devices and receives the results in accordance with example embodiments of the systems and methods disclosed herein.

FIG. 7 shows a diagram of an example embodiment of the disclosure wherein a site controller can broadcast one or more tests to one or more devices and receives the results in accordance with example embodiments of the systems and methods disclosed herein. As shown in FIG. 7, a site controller 702 can broadcast one or more poll signals to the device under test on an input wafer 704 including several devices under test. The poll can further include device identifiers. The site controller 702 can further send signaling and/or test signals to the devices under test on the input wafer 704. The tests and/or signaling can include, but is not limited to, one or more of a system test, a system boot, a BSCAN, a TAP, an RF module link, a scan system, and/or a BIST/PBIST. In one embodiment, the input wafer 704 comprising the devices under test can be placed on a charging pad 706 (for example, an inductive charging pad).

The charging pad 706 can be used to wirelessly provide power to the devices under test, thereby reducing the number of wired connections that must be made to each device under test and thus improving throughput and efficiency. Alternatively or additionally, the devices of the input wafer 704 can be partially or fully powered by a wired connection in addition to or in place of the wireless power charging (e.g., the wireless charging pad 706). At the conclusion of the testing, the tested (output) wafer 708 can be used to identify the defective devices (e.g., 710 and 712). The defective devices can be removed from the tray, for example, by a pick and place technique. Alternatively or additionally, the defective devices can be discarded, for example, as a part of or following a depaneling and/or singulation step.

In various embodiments, the computer(s) of the tester may be any one of suitable devices that may be configured to execute one or more applications, software, and/or instructions to provide one or more sensor signals, and/or communications signals. The computer(s) of the tester, as used herein, may be any variety of electronic devices, communications devices, and/or mobile devices. The computer(s) of the tester may include, but is not limited to, a tablet computing device, an electronic book (ebook) reader, a netbook computer, a notebook computer, a laptop computer, a desktop computer, a personal digital assistant (PDA), a smart phone, or the like. While the drawings and/or specification may portray the computer(s) of the tester in the likeness of a laptop computer, desktop computer, or tablet computer device, the disclosure is not limited to such. Indeed, the systems and methods described herein may apply to any electronic device generating a sensor signal, and/or communication signal.

The networks on which the tester and the device under test communicate may include any one or a combination of different types of suitable communications networks, such as cable networks, the Internet, wireless networks, cellular networks, and other private and/or public networks. Furthermore the network may include any variety of medium over which network traffic is carried including, but not limited to, coaxial cable, twisted wire pair, optical fiber, hybrid fiber coaxial (HFC), microwave terrestrial transceivers, radio frequency communications, satellite communications, or combinations thereof. It is also noted that the described techniques may apply in other client/server arrangements (e.g., set-top boxes, etc.), as well as in non-client/server arrangements (e.g., locally stored software applications, etc.).

Further, the tester and/or the device under test may be configured to communicate using one or more communications infrastructures and/or devices using any suitable communication formats and/or protocols including, but not limited to, Wi-Fi, direct Wi-Fi, Bluetooth, 3G mobile communication, 4G mobile communication, long-term evolution (LTE), WiMax, direct satellite communications, or any combinations thereof. The tester and/or the device under test may communicate with other communications infrastructures and/or devices to receive and then retransmit information, such as data packets. The tester and/or the device under test may be configured to receive wireless communications signals. These communications signals may be wireless signals that include test and signal information, and/or device identification information. These test and signal information, and/or device identification information, may be data that is identified by the tester and/or the device under test and coded on to and carried by the wireless signal that is received.

The tester and/or the device under test may include one or more processor(s), input/output (I/O) interface(s), a radio, network interface(s), and memory. The processors may be implemented as appropriate in hardware, software, firmware, or combinations thereof. Software or firmware implementations of the processors may include computer-executable or machine-executable instructions written in any suitable programming language to perform the various functions described. Hardware implementations of the processors may be configured to execute computer-executable or machine-executable instructions to perform the various functions described. In example embodiments, the processors may be configured to execute instructions, software, and/or applications stored in the memory. The one or more processors may include, without limitation, a central processing unit (CPU), a digital signal processor (DSP), a reduced instruction set computer (RISC), a complex instruction set computer (CISC), a System-on-a-Chip (SoC), a microprocessor, a microcontroller, a field programmable gate array (FPGA), or any combination thereof. The tester and/or the device under test may also include a chipset for controlling communications between one or more processors and one or more of the other components of the tester and/or the device under test. The processors may also include one or more application specific integrated circuits (ASICs) a System-on-a-Chip (SoC), or application specific standard products (ASSPs) for handling specific data processing functions or tasks. In certain embodiments, the tester and/or the device under test may be based on an Intel® Architecture system and the one or more processors and chipsets may be from a family of Intel® processors and chipsets, such as the Intel® Atom® processor family.

One or more I/O device interfaces may enable the use of one or more (I/O) device(s) or user interface(s), such as a touch sensitive screen, keyboard, and/or mouse on the tester and/or the device under test. A user may be able to administer a test and send and receive information from the tester and/or the device under test by interacting with the user interfaces via the I/O device interfaces. One or more network interfaces(s) may allow the tester and/or the device under test to communicate via the one or more network(s) and/or via other suitable communicative channels. For example, the tester and/or the device under test may be configured to communicate with stored databases, other computing devices or servers, user terminals, or other devices on the networks.

The radio may include any suitable radio for transmitting and/or receiving radio frequency (RF) signals in the bandwidth and/or channels corresponding to the communications protocols utilized by the tester and/or the devices under test to communicate with other testers and/or devices under test. The radio component may include hardware and/or software to modulate communications signals according to pre-established transmission protocols. The radio component may be configured to generate communications signals for one or more communications protocols including, but not limited to, Wi-Fi, direct Wi-Fi, Bluetooth, 3G mobile communication, 4G mobile communication, long-term evolution (LTE), WiMax, direct satellite communications, or combinations thereof. In alternative embodiments, protocols may be used for communications between the tester and/or the device under test, such as Bluetooth, dedicated short-range communication (DSRC), or other packetized radio communications. The radio component may include any known receiver and baseband suitable for communicating via the communications protocols of the tester and/or the device under test. The radio component may further include a low noise amplifier (LNA), additional signal amplifiers, an analog-to-digital (A/D) converter, one or more buffers, and digital baseband. In certain embodiments, the communications signals generated by the radio may be transmitted via an antenna on the tester and/or the device under test.

A memory associated with the tester and/or the device under test may include one or more volatile and/or non-volatile memory devices including, but not limited to, magnetic storage devices, read only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read only memory (EEPROM), non-volatile RAM (NVRAM), universal serial bus (USB) removable memory, or combinations thereof.

The memory may store program instructions that are loadable and executable on the processor(s), as well as data generated or received during the execution of these programs. The memory may have stored thereon software modules including an operating system (O/S) module, applications module, communications module, data files, and the like. Each of the modules, files, and/or software stored on the memory may provide functionality for the tester and/or the device under test, when executed by the processors.

The O/S module may have one or more operating systems stored thereon. The processors may be configured to access and execute one or more operating systems stored in the (O/S) module to operate the system functions of the tester and/or the device under test. System functions, as managed by the operating system may include memory management, processor resource management, driver management, application software management, system configuration, and the like. The operating system may be any variety of suitable operating systems including, but not limited to, Google® Android®, Microsoft® Windows®, Microsoft® Windows® Server®, Linux, Apple® OS-X®, or the like.

An application(s) module associated with the tester and/or the device under test may contain instructions and/or applications thereon that may be executed by the processors to provide one or more functionality associated with the tester and/or the device under test. These instructions and/or applications may, in certain aspects, interact with the (O/S) module and/or other modules of the tester and/or the device under test. The applications module may have instructions, software, and/or code stored thereon that may be launched and/or executed by the processors to execute one or more applications and functionality associated therewith. These applications may include, but are not limited to, functionality such as web browsing, business, communications, graphics, word processing, publishing, spreadsheets, databases, gaming, education, entertainment, media, project planning, engineering, drawing, or combinations thereof.

A communications module associated with the tester and/or the device under test may have instructions stored thereon that, when executed by the processors, enable the tester and/or the device under test to provide a variety of communications functionality. In one aspect, the processors, by executing instructions stored in the communications module, may be configured to demodulate and/or decode communications signals received by the tester and/or the device under test via an antenna and radio. The received communications signals may further carry audio, beacons data, handshaking, information, and/or other data thereon. In another aspect, the processors, by executing instructions from at least the communications module, may be configured to generate and transmit communications signals via the radio and/or the antenna. The processors may encode and/or modulate communications signals to be transmitted by the tester and/or the device under test.

Embodiments described herein may be implemented using hardware, software, and/or firmware, for example, to perform the methods and/or operations described herein. Certain embodiments described herein may be provided as one or more tangible machine-readable media storing machine-executable instructions that, if executed by a machine, cause the machine to perform the methods and/or operations described herein. The tangible machine-readable media may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of tangible media suitable for storing electronic instructions. The machine may include any suitable processing or computing platform, device or system and may be implemented using any suitable combination of hardware and/or software. The instructions may include any suitable type of code and may be implemented using any suitable programming language. In other embodiments, machine-executable instructions for performing the methods and/or operations described herein may be embodied in firmware. Additionally, in certain embodiments, a special-purpose computer or a particular machine may be formed in order to identify actuated input elements and process the identifications.

Figure 8:
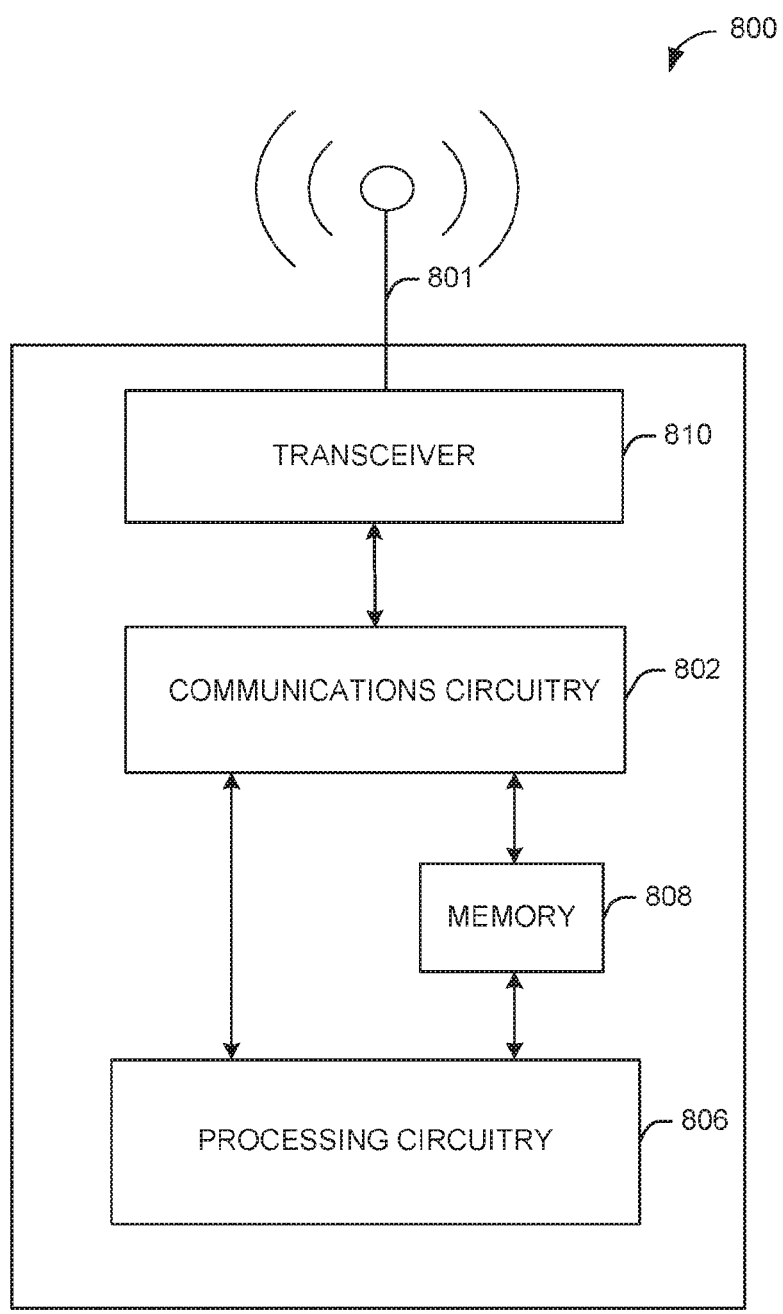
FIG. 8 illustrates a functional diagram of an example communication station that may be used as part of the tester and/or the device under test, in accordance with one or more example embodiments of the disclosure.

FIG. 8 shows a functional diagram of an exemplary communication station 800 in accordance with some embodiments. In one embodiment, FIG. 8 illustrates a functional block diagram of a communication station that may be suitable for use as part of a tester and/or a device under test (e.g., through the wireless connectivity portions of the tester and/or the device under test) in accordance with some embodiments. The communication station 800 may also be suitable for use as a handheld device, mobile device, cellular telephone, smartphone, tablet, netbook, wireless terminal, laptop computer, wearable computer device, femtocell, High Data Rate (HDR) subscriber station, access point, access terminal, or other personal communication system (PCS) device.

The communication station 800 may include communications circuitry 802 and a transceiver 810 for transmitting and receiving signals to and from other communication stations using one or more antennas 801. The communications circuitry 802 may include circuitry that can operate the physical layer communications and/or medium access control (MAC) communications for controlling access to the wireless medium, and/or any other communications layers for transmitting and receiving signals. The communication station 800 may also include processing circuitry 806 and memory 808 arranged to perform the operations described herein. In some embodiments, the communications circuitry 802 and the processing circuitry 806 may be configured to perform operations detailed in FIGS. 1-7.

In accordance with some embodiments, the communications circuitry 802 may be arranged to contend for a wireless medium and configure frames or packets for communicating over the wireless medium. The communications circuitry 802 may be arranged to transmit and receive signals, (e.g., test signals). The communications circuitry 802 may also include circuitry for modulation/demodulation, upconversion/downconversion, filtering, amplification, etc. In some embodiments, the processing circuitry 806 of the communication station 800 may include one or more processors. In other embodiments, two or more antennas 801 may be coupled to the communications circuitry 802 arranged for sending and receiving signals. The memory 808 may store information for configuring the processing circuitry 806 to perform operations for configuring and transmitting message frames and performing the various operations described herein. The memory 808 may include any type of memory, including non-transitory memory, for storing information in a form readable by a machine (e.g., a computer). For example, the memory 808 may include a computer-readable storage device, read-only memory (ROM), random-access memory (RAM), magnetic disk storage media, optical storage media, flash-memory devices and other storage devices and media.

In some embodiments, the communication station 800 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), a wearable computer device, or another device that may receive and/or transmit information wirelessly.

In some embodiments, the communication station 800 may include one or more antennas 801. The antennas 801 may include one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated for spatial diversity and the different channel characteristics that may result between each of the antennas and the antennas of a transmitting station.

In some embodiments, the communication station 800 may include one or more of a keyboard, a display, a non-volatile memory port, multiple antennas, a graphics processor, an application processor, speakers, and other mobile device elements. The display may be an LCD screen including a touch screen.

Although the communication station 800 is illustrated as having several separate functional elements, two or more of the functional elements may be combined and may be implemented by combinations of software-configured elements, such as processing elements including digital signal processors (DSPs), and/or other hardware elements. For example, some elements may include one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the communication station 800 may refer to one or more processes operating on one or more processing elements.

Certain embodiments may be implemented in one or a combination of hardware, firmware, and software. Other embodiments may also be implemented as instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the communication station 800 may include one or more processors and may be configured with instructions stored on a computer-readable storage device memory.

Figure 9:
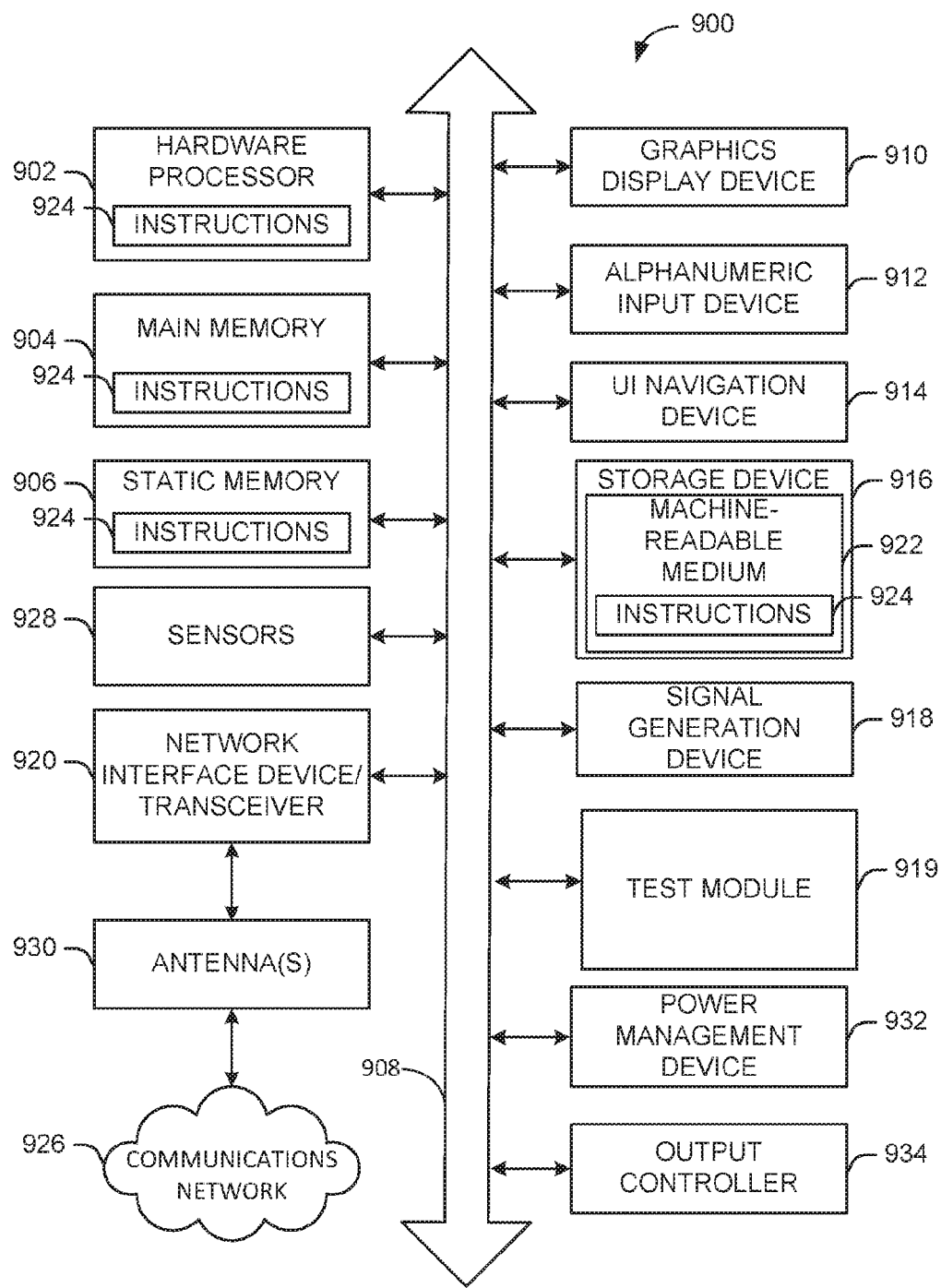
FIG. 9 shows a block diagram of an example machine upon which any of one or more techniques (e.g., methods) may be performed, for example, as part of the tester and/or the device under test, in accordance with one or more embodiments of the disclosure.

FIG. 9 illustrates a block diagram of an example of a machine 900 or system upon which any one or more of the techniques (e.g., methodologies) discussed herein may be performed. For example, it can represent portions of the tester and/or a device under test (e.g., through the wireless connectivity portions of the tester and/or the device under test). In other embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environments. The machine 900 may be a personal computer (PC), a tablet PC, a set-top box (STB), a personal digital assistant (PDA), a mobile telephone, wearable computer device, a web appliance, a network router, switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 900 may include a hardware processor 902 (e.g., a central processing unit (CPU), a graphics processing unit (GPU), a hardware processor core, or any combination thereof), a main memory 904 and a static memory 906, some or all of which may communicate with each other via an interlink (e.g., bus) 908. The machine 900 may further include a power management device 932, a graphics display device 910, an alphanumeric input device 912 (e.g., a keyboard), and a user interface (UI)

navigation device 914 (e.g., a mouse). In an example, the graphics display device 910, alphanumeric input device 912, and UI navigation device 914 may be a touch screen display. The machine 900 may additionally include a storage device (i.e., drive unit) 916, a signal generation device 918 (e.g., a speaker), a test module 919, a network interface device/transceiver 920 coupled to antenna(s) 930, and one or more sensors 928, such as a global positioning system (GPS) sensor, compass, accelerometer, or other sensor. The machine 900 may include an output controller 934, such as a serial (e.g., universal serial bus (USB), parallel, or other wired or wireless (e.g., infrared (IR), near field communication (NFC), etc.) connection to communicate with or control one or more peripheral devices (e.g., a printer, card reader, etc.)). The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, or within the hardware processor 902 during execution thereof by the machine 900. In an example, one or any combination of the hardware processor 902, the main memory 904, the static memory 906, or the storage device 916 may constitute machine-readable media. The test module 919 may be configured to establish a wireless connection between a device and a tester device; receive a first signal from the tester device, the signal comprising a first test of the functionality of the device; cause to send the first test to a test module on the device; receive from the test module, a first result associated with the first test; and causing to send the first result to the tester device. The test module 919 can further cause the test module to apply the first test to one or more of a logical circuit or a memory associated with the device. The test module 919 can also cause a high bandwidth communication circuitry associated with the device to apply a second test to the device. In one embodiment, the second test further comprises a test of one or more scan blocks associated with the device.

It is understood that the above are only a subset of what the test module 919 may be configured to perform and that other functions included throughout this disclosure may also be performed by the test module 919.

While the machine-readable medium 922 is illustrated as a single medium, the term "machine-readable medium" may include a single medium or multiple media (e.g., a centralized or distributed database, and/or associated caches and servers) configured to store the one or more instructions 924.

The term "machine-readable medium" may include any medium that is capable of storing, encoding, or carrying instructions for execution by the machine 900 and that cause the machine 900 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., Electrically Programmable Read-Only Memory (EPROM), or Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device/transceiver 920 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), Plain Old Telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 920 may include one or more physical jacks (e.g., Ethernet, coaxial, or phone jacks) or one or more antennas to connect to the communications network 926. In an example, the network interface device/transceiver 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900 and includes digital or analog communications signals or other intangible media to facilitate communication of such software. The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Figure 10:
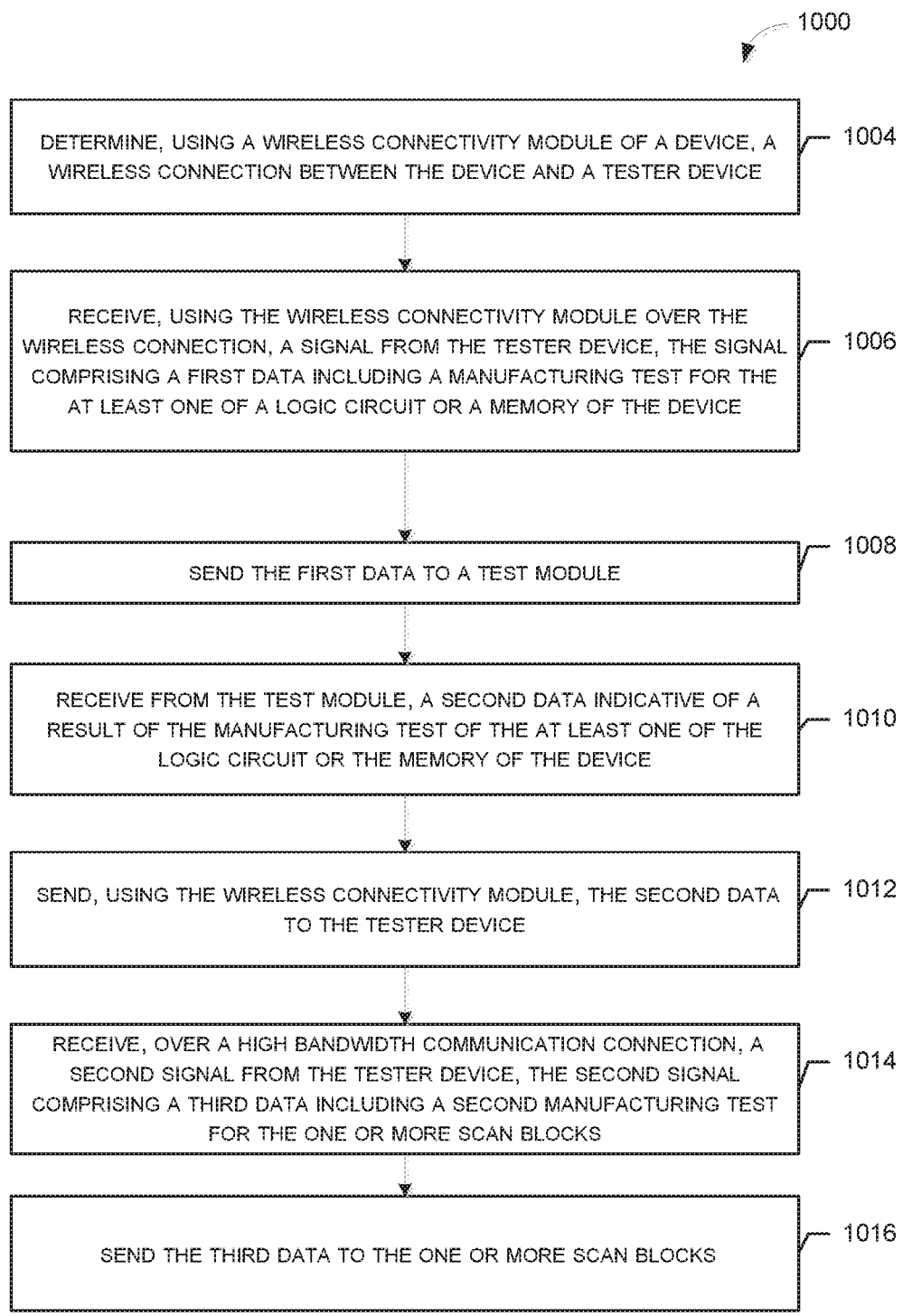
FIG. 10 shows a diagram of an example flow chart for the example operation of the wireless testing of devices in accordance with one or more example embodiments of the systems and methods disclosed herein.

FIG. 10 shows a diagram 1000 of an example flow chart for the example operation of the wireless testing of devices in accordance with one or more example embodiments of the systems and methods disclosed herein. In block 1004, a wireless connection between a device and a tester device can be determined using a wireless connectivity module of the device. In 1006, a signal can be received from the tester device using the wireless connectivity module over the wireless connection. The signal can include a first data including a manufacturing test for the at least one of a logic circuit or a memory of the device. In 1008, the first data can be sent to a test module. In 1010, a second data indicative of a result of the manufacturing test of the at least one of the logic circuit or the memory of the device can be received from a test module. In 1012, the second data can be sent to the tester device using the wireless connectivity module. In 1014, a second signal from the tester device can be received over a high bandwidth communication connection. The second signal can include a third data including a second manufacturing test for the one or more scan blocks. In 1016, the third data can be sent to the one or more scan blocks.

According to example embodiments of the disclosure, there may be a device. The device may have at least one memory that stores computer-executable instructions, a test block comprising a test module for testing at least one of a logic circuit or a memory of the device and may have a wireless connectivity module configured to wirelessly communicate with a tester device. The device may have at least one or more processors configured to access the at least one memory, wherein the at least one processor may be configured to execute computer instructions including: determining, using the wireless connectivity module, a wireless connection between the device and the tester device; receiving, using the wireless connectivity module over the wireless connection, a signal from the tester device, the signal comprising a first data including a manufacturing test for the at least one of the logic circuit or the memory of the device; causing to send the first data to the test module of the test block; receiving from the test module, a second data indicative of a result of the manufacturing test of the at least one of the logic circuit or the memory of the device; and causing to send, using the wireless connectivity module, over the wireless connection, the second data to the tester device.

Implementation may include one or more of the following features. The connectivity module may comprise wireless communication for circuitry for low bandwidth communication and the circuitry may comprise a Bluetooth transceiver. The test module may be configured to execute the manufacturing test on the at least one of the logic circuit or the memory of the device. The wireless connectivity module may comprise an embedded controller and may be in communication with an external board which may include wireless communication circuitry for wireless communication with the tester device. The test block may comprise one or more scan blocks to be tested by a second manufacturing test received over a high bandwidth communication connection with the tester device. The wireless connectivity module may include high bandwidth communication circuitry wherein the at least one or more processors of the wireless connectivity circuit may be further configured to execute computer-executable instructions to: receive, using the high bandwidth communication connection, a second signal from the tester device, the second signal comprising a third data including the second manufacturing test for the one or more scan blocks; cause to send the third data to the one or more scan blocks; receive from the scan blocks, a fourth data indicative of a result of the second manufacturing test of the one or more scan blocks; and cause to send, using the high bandwidth communication connection, the fourth data to the tester device. The high bandwidth communication circuitry may comprise WiFi or a WiGig transceiver. The wireless connectivity module, which may further comprise an embedded controller, may include a high bandwidth wired connection interface for wired communication with the tester device wherein the high bandwidth wired connection interface further comprises a Peripheral Component Interconnect Express (PCIe) connection.

According to example embodiments of the disclosure, there may be a computer-readable storage device. The computer-readable storage device may have instructions programmed thereon that, in response to execution, cause a first device to perform or facilitate operations comprising: determining, using the wireless connectivity module, a wireless connection between the device and the tester device; receiving, using the wireless connectivity module over the wireless connection, a signal from the tester device, the signal comprising a first data including a manufacturing test for the at least one of the logic circuit or the memory of the device; causing to send the first data to the test module of the test block; receiving from the test module, a second data indicative of a result of the manufacturing test of the at least one of the logic circuit or the memory of the device; and causing to send, using the wireless connectivity module, over the wireless connection, the second data to the tester device.

Implementation may include one or more of the following features. The connectivity module may comprise wireless communication for circuitry for low bandwidth communication and the circuitry may comprise a Bluetooth transceiver. The test module may be configured to execute the manufacturing test on the at least one of the logic circuit or the memory of the device. The wireless connectivity module may comprise an embedded controller and may be in communication with an external board which may include wireless communication circuitry for wireless communication with the tester device. The test block may comprise one or more scan blocks to be tested by a second manufacturing test received over a high bandwidth communication connection with the tester device. The wireless connectivity module may include high bandwidth communication circuitry wherein the computer instructions may further comprise: receiving, using the high bandwidth communication connection, a second signal from the tester device, the second signal comprising a third data including the second manufacturing test for the one or more scan blocks; causing to send the third data to the one or more scan blocks; receiving from the scan blocks, a fourth data indicative of a result of the second manufacturing test of the one or more scan blocks; and causing to send, using the high bandwidth communication connection, the fourth data to the tester device. The high bandwidth communication circuitry may comprise WiFi or a WiGig transceiver. The wireless connectivity module, which may further comprise an embedded controller, may include a high bandwidth wired connection interface for wired communication with the tester device wherein the high bandwidth wired connection interface further comprises a Peripheral Component Interconnect Express (PCIe) connection.

According to example embodiments of the disclosure, there may be a method. The method may comprise: determining, using the wireless connectivity module of a device, a wireless connection between the device and the tester device; receiving, using the wireless connectivity module over the wireless connection, a signal from the tester device, the signal comprising a first data including a manufacturing test for the at least one of the logic circuit or the memory of the device; causing to send the first data to the test module; receiving from the test module, a second data indicative of a result of the manufacturing test of the at least one of the logic circuit or the memory of the device; and causing to send, using the wireless connectivity module, the second data to the tester device.

Implementation may include one or more of the following features. The connectivity module may comprise wireless communication for circuitry for low bandwidth communication and the circuitry may comprise a Bluetooth transceiver. The test module may be configured to execute the manufacturing test on the at least one of the logic circuit or the memory of the device. The wireless connectivity module may comprise an embedded controller and may be in communication with an external board which may include wireless communication circuitry for wireless communication with the tester device. The test block may comprise one or more scan blocks to be tested by a second manufacturing test received over a high bandwidth communication connection with the tester device. The wireless connectivity module may include high bandwidth communication circuitry wherein the method may further comprise: receiving, using the high bandwidth communication connection, a second signal from the tester device, the second signal comprising a third data including the second manufacturing test for the one or more scan blocks; causing to send the third data to the one or more scan blocks; receiving from the scan blocks, a fourth data indicative of a result of the second manufacturing test of the one or more scan blocks; and causing to send, using the high bandwidth communication connection, the fourth data to the tester device. The high bandwidth communication circuitry may comprise WiFi or a WiGig transceiver. The wireless connectivity module, which may further comprise an embedded controller, may include a high bandwidth wired connection interface for wired communication with the tester device wherein the high bandwidth wired connection interface further comprises a Peripheral Component Interconnect Express (PCIe) connection.

According to example embodiments of the disclosure, there may be an apparatus. The apparatus may comprise: means for determining, using the wireless connectivity module, a wireless connection between the device and the tester device; means for receiving, using the wireless connectivity module over the wireless connection, a signal from the tester device, the signal comprising a first data including a manufacturing test for the at least one of the logic circuit or the memory of the device; means for causing to send the first data to the test module of the test block; means for receiving from the test module, a second data indicative of a result of the manufacturing test of the at least one of the logic circuit or the memory of the device; and causing to send, using the wireless connectivity module, over the wireless connection, the second data to the tester device.

Implementation may include one or more of the following features. The connectivity module may comprise wireless communication for circuitry for low bandwidth communication and the circuitry may comprise a Bluetooth transceiver. The test module may be configured to execute the manufacturing test on the at least one of the logic circuit or the memory of the device. The wireless connectivity module may comprise an embedded controller and may be in communication with an external board which may include wireless communication circuitry for wireless communication with the tester device. The test block may comprise one or more scan blocks to be tested by a second manufacturing test received over a high bandwidth communication connection with the tester device. The wireless connectivity module may include high bandwidth communication circuitry wherein the apparatus may further comprise: means for receiving, using the high bandwidth communication connection, a second signal from the tester device, the second signal comprising a third data including the second manufacturing test for the one or more scan blocks; means for causing to send the third data to the one or more scan blocks; means for receiving from the scan blocks, a fourth data indicative of a result of the second manufacturing test of the one or more scan blocks; and means for causing to send, using the high bandwidth communication connection, the fourth data to the tester device. The high bandwidth communication circuitry may comprise WiFi or a WiGig transceiver. The wireless connectivity module, which may further comprise an embedded controller, may include a high bandwidth wired connection interface for wired communication with the tester device wherein the high bandwidth wired connection interface further comprises a Peripheral Component Interconnect Express (PCIe) connection.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the claims. Although specific terms are employed herein, they are used in a generic and descriptive sense only, and not for purposes of limitation.

This written description uses examples to disclose certain example embodiments, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:
1. A device, comprising:
a memory that stores computer-executable instructions;
a logic circuit;
a test block comprising one or more scan blocks and a test module configured to test at least one of the logic circuit or the memory of the device;
a wireless connectivity module configured to wirelessly communicate with a tester device, the wireless connectivity module comprising a first communication circuitry and a second communication circuitry, the second communication circuitry comprising a high bandwidth wireless communication connection; and
at least one processor of one or more processors configured to access the memory, wherein the at least one processor of the one or more processors is configured to execute the computer-executable instructions to:
determine, using the first communication circuitry of the wireless connectivity module, a first wireless connection between the device and the tester device;
determine, using the second communication circuitry of the wireless connectivity module, a second wireless connection between the device and the tester device;
receive, using the first communication circuitry over the first wireless connection, a first signal from the tester device, the first signal comprising first data including a manufacturing test for at least one of the logic circuit or the memory of the device;
cause to send the first data to the test module of the test block;
receive, using the second communication circuitry over the second wireless connection, a second signal from the tester device, the second signal comprising second data including a scan pattern for a scan test;

convert, using a serial to parallel scan converter, the scan pattern to a number of parallel scan inputs;

cause to send the parallel scan inputs to the one or more scan blocks of the device;

receive from the test module, third data indicative of a result of the manufacturing test;

receive from the one or more scan blocks, fourth data indicative of a result of the scan test;

cause to send, using the wireless connectivity module over the first wireless connection, the third data to the tester device; and cause to send, using the wireless connectivity module over the second wireless connection, the fourth data to the tester device.

2. The device of claim 1, wherein the wireless connectivity module comprises wireless communication circuitry for low bandwidth communication.

3. The device of claim 2, wherein the wireless communication circuitry comprises a Bluetooth transceiver.

4. The device of claim 1, wherein the test module is configured to execute the manufacturing test on at least one of the logic circuit or the memory of the device.

5. The device of claim 1, wherein the wireless connectivity module is in communication with an external board that includes a wireless communication circuitry for wireless communication with the tester device.

6. The device of claim 1, wherein the wireless connectivity module further comprises an embedded controller that activates a wireless communication circuitry of the wireless connectivity module.

7. The device of claim 1, wherein the second communication circuitry comprises a WiFi or a WiGig transceiver.

8. The device of claim 1, wherein the wireless connectivity module includes a high bandwidth wired connection interface for wired communication with the tester device.

9. The device of claim 8, wherein the high bandwidth wired connection interface further comprises a Peripheral Component Interconnect Express (PCIe) connection.

10. The device of claim 7, wherein the wireless connectivity module further comprises an embedded controller that activates the second communication circuitry of the wireless connectivity module.

11. A non-transitory computer-readable medium storing computer-executable instructions which, when executed by a processor, cause the processor to perform operations comprising:

determining, by the processor, a first wireless connection and a second wireless connection between a device and a tester device, the second wireless connection comprising a high bandwidth wireless communication connection;

receiving, by the processor, over the first wireless connection, a first signal from the tester device, the first signal comprising first data including a manufacturing test for at least one of a logic circuit or a memory of the device;

causing to send, by the processor, the first data to a test module of a test block of the device;

receiving, by the processor, over the second wireless connection, a second signal from the tester device, the second signal comprising second data including a scan pattern for a scan test;

converting, using a serial to parallel scan converter, the scan pattern to a number of parallel scan inputs;

sending, by the processor, the parallel scan inputs to one or more scan blocks of the device;

receiving, by the processor, from the test module, third data indicative of a result of the manufacturing test;

receiving, by the processor, from the one or more scan blocks, fourth data indicative of a result of the scan test;

causing to send, by the processor, over the first wireless connection, the third data to the tester device; and causing to send, by the processor, over the second wireless connection, the fourth data to the tester device.

12. The non-transitory computer-readable medium of claim 11, wherein the instructions to cause to send the first data to the test module of the test block further comprise instructions to execute the manufacturing test on at least one of the logic circuit or the memory of the device.

13. A method comprising:

determining, using a first communication circuitry of a wireless connectivity module of a device, a first wireless connection between the device and a tester device;

determining, using a second communication circuitry of the wireless connectivity module, a second wireless connection between the device and the tester device, the second wireless connection comprising a high bandwidth wireless communication connection;

receiving, using the first communication circuitry over the first wireless connection, a first signal from the tester device, the first signal comprising first data including a manufacturing test for at least one of a logic circuit or a memory of the device;

sending the first data to a test module;

receiving, using the second communication circuitry over the second wireless connection, a second signal from the tester device, the second signal comprising second data including a scan pattern for a scan test;

converting, using a serial to parallel scan converter, the scan pattern to a number of parallel scan inputs;

sending the parallel scan inputs to one or more scan blocks of the device;

receiving from the test module, third data indicative of a result of the manufacturing test;

receiving from the one or more scan blocks, fourth data indicative of a result of the scan test;

sending, using the first communication circuitry of the wireless connectivity module, the third data to the tester device; and sending, using the second communication circuitry of the wireless connectivity module, the fourth data to the tester device.

14. The method of claim 13, further comprising executing the manufacturing test on at least one of the logic circuit or the memory of the device.

* * * * *